US006653267B2

(12) United States Patent
Yano et al.

(10) Patent No.: US 6,653,267 B2
(45) Date of Patent: Nov. 25, 2003

(54) AQUEOUS DISPERSION FOR CHEMICAL MECHANICAL POLISHING USED FOR POLISHING OF COPPER

(75) Inventors: Hiroyuki Yano, Kanagawa (JP); Gaku Minamihaba, Kanagawa (JP); Masayuki Motonari, Tokyo (JP); Masayuki Hattori, Tokyo (JP); Nobuo Kawahashi, Tokyo (JP)

(73) Assignees: Kabushiki Kaisha Toshiba, Kawasaki (JP); JSR Corporation, Tokyo (JP)

( * ) Notice: Subject to any disclaimer, the term of this patent is extended or adjusted under 35 U.S.C. 154(b) by 55 days.

(21) Appl. No.: 09/893,961

(22) Filed: Jun. 29, 2001

(65) Prior Publication Data

US 2002/0016275 A1 Feb. 7, 2002

(30) Foreign Application Priority Data

Jun. 30, 2000 (JP) ........................................ 2000-199462

(51) Int. Cl.[7] .......................... C11D 3/28; C11D 3/395; C11D 1/12
(52) U.S. Cl. ...................... 510/254; 510/175; 510/256; 510/262; 510/263; 510/268; 510/367; 510/372; 510/375; 510/395; 510/426
(58) Field of Search ................... 510/175, 254, 510/256, 262, 263, 268, 367, 372, 375, 395, 426

(56) References Cited

U.S. PATENT DOCUMENTS

| 5,405,412 | A | * | 4/1995 | Willey et al. .................... 8/111 |
| 5,575,837 | A | | 11/1996 | Kodama et al. |
| 5,607,718 | A | | 3/1997 | Sasaki et al. |
| 5,690,539 | A | | 11/1997 | Swidler et al. |
| 5,738,800 | A | | 4/1998 | Hosali et al. |
| 5,756,398 | A | | 5/1998 | Wang et al. |
| 5,775,980 | A | | 7/1998 | Sasaki et al. |
| 5,954,997 | A | * | 9/1999 | Kaufman et al. .......... 252/79.1 |
| 6,036,758 | A | * | 3/2000 | Fairweather ............. 106/14.44 |
| 6,083,840 | A | * | 7/2000 | Mravic et al. .............. 438/693 |
| 6,171,352 | B1 | * | 1/2001 | Lee et al. ...................... 51/307 |
| 6,348,076 | B1 | * | 2/2002 | Canaperi et al. ............. 51/309 |
| 6,375,545 | B1 | * | 4/2002 | Yano et al. .................... 451/36 |
| 6,444,139 | B1 | * | 9/2002 | Minamihaba et al. ......... 216/89 |
| 6,454,819 | B1 | * | 9/2002 | Yano et al. .................... 51/298 |

FOREIGN PATENT DOCUMENTS

| JP | 4-291722 | 10/1992 |
| JP | 4-291723 | 10/1992 |
| JP | 4-291724 | 10/1992 |
| JP | 8-83780 | 3/1996 |
| JP | 9-55363 | 2/1997 |
| JP | 9-82668 | 3/1997 |
| JP | 10-116804 | 5/1998 |
| JP | 10-270447 | 10/1998 |
| JP | 11-21546 | 1/1999 |
| JP | 11-40526 | 2/1999 |
| JP | 11-135466 | 5/1999 |

\* cited by examiner

*Primary Examiner*—Charles Boyer
(74) *Attorney, Agent, or Firm*—Oblon, Spivak, McClelland, Maier & Neustadt, P.C.

(57) ABSTRACT

The present invention provides an aqueous dispersion for chemical mechanical polishing suitable for polishing of copper, which has a high polishing speed and a low erosion rate with overpolishing. The aqueous dispersion for chemical mechanical polishing of the invention contains a compound having a heterocycle, a surfactant and an oxidizing agent, wherein the compound having a heterocycle and the surfactant are in a weight ratio of 1:10 to 1:0.03. The aqueous dispersion may also contain abrasive particle. The compound having a heterocycle is preferably quinaldic acid, benzotriazole or the like. The surfactant is preferably a sulfonic acid salt such as potassium dodecylbenzenesulfonate or ammonium dodecylbenzenesulfonate, and the oxidizing agent is preferably ammonium persulfate, hydrogen peroxide or the like. The abrasive particle used may be inorganic particle such as colloidal silica, an organic particle such as polymer particle, or an organic/inorganic composite particle comprising a combination thereof.

14 Claims, No Drawings

AQUEOUS DISPERSION FOR CHEMICAL MECHANICAL POLISHING USED FOR POLISHING OF COPPER

BACKGROUND OF THE INVENTION

The present invention relates to an aqueous dispersion for chemical mechanical polishing (hereunder referred to simply as "aqueous dispersion") that is useful for polishing of copper during manufacture of semiconductor devices. More specifically, it relates to an aqueous dispersion for chemical mechanical polishing that can be suitably used in the wiring formation steps for semiconductor devices that require combinations of fine wiring of about 0.1 µm to thick wiring of about 100 µm, such as in DRAMs, high-speed logic LSIs and the like.

High densification of semiconductor devices has led to advances in micronization of formed wirings in recent years. The damascene method is well known as a technique allowing further micronization of wiring. This method involves embedding a wiring material in a groove or the like formed in an insulating material, and then removing the excess wiring material by chemical mechanical polishing to form the desired wiring. High-speed polishing is desired for this method in order to achieve improved yields in the polishing step.

When polishing an initial excess film [thickness X (Å)] with the wiring material embedded in the groove at a polishing rate V (Å/min), the intended polishing should be achievable in the time X/V (min), but in actual semiconductor device manufacturing steps, wiring material left at sections other than the groove is also removed, such that overpolishing is carried out for a time exceeding X/V (min). Here, overpolishing of the wiring sections can result in formation of pit shapes. Such pit-shaped wiring is known as "erosion", and is undesirable since it lowers yields of the semiconductor device.

In light of these circumstances, it has been a goal to achieve an aqueous dispersion for chemical mechanical polishing that can polish wiring materials at high speed in chemical mechanical polishing steps while also producing no erosion when overpolishing is conducted. However, an aqueous dispersion for chemical mechanical polishing having such function has not yet been proposed.

SUMMARY OF THE INVENTION

It is an object of the present invention to overcome these problems by providing an aqueous dispersion for chemical mechanical polishing that realizes high polishing speed in chemical mechanical polishing steps and can be used for polishing of copper while minimizing erosion and erosion rates in the course of overpolishing.

The present invention is as follows.

1. An aqueous dispersion for chemical mechanical polishing used for polishing of copper characterized by containing (A) a compound having a heterocycle, (B) a surfactant and (C) an oxidizing agent, wherein the weight ratio of the (A) and (B) is 1:10 to 1:0.03.
2. An aqueous dispersion for chemical mechanical polishing used for polishing of copper according to 1 above, wherein the (A) compound having the heterocycle is a compound having a condensed ring composed of a benzene ring or naphthalene ring and a heteropentacycle or heterohexacycle with at least one nitrogen atom.
3. An aqueous dispersion for chemical mechanical polishing used for polishing of copper according to 2 above, wherein the compound having the condensed ring includes a structure selected from among quinoline, isoquinoline, benzotriazole, benzimidazole, indole, isoindole, quinazoline, cinnoline, quinoxaline, phthalazine and acridine.
4. An aqueous dispersion for chemical mechanical polishing used for polishing of copper according to 3 above, wherein the compound having the condensed ring is at least one selected from among quinaldic acid, benzotriazole and benzimidazole.
5. An aqueous dispersion for chemical mechanical polishing used for polishing of copper according to 4 above, wherein the (B) surfactant is an anionic surfactant.
6. An aqueous dispersion for chemical mechanical polishing used for polishing of copper according to 5 above, wherein said anionic surfactant is a sulfonic acid salt.
7. An aqueous dispersion for chemical mechanical polishing used for polishing of copper according to 6 above, wherein said sulfonic acid salt is at least one selected from ammonium dodecylbenzenesulfonate and potassium dodecylbenzenesulfonate.
8. An aqueous dispersion for chemical mechanical polishing used for polishing of copper according to 5 above, wherein said (C) oxidizing agent is at least one selected from among ammonium persulfate, potassium persulfate and hydrogen peroxide.
9. An aqueous dispersion for chemical mechanical polishing used for polishing of copper according to 2 above, which further contains (D) an abrasive.
10. An aqueous dispersion for chemical mechanical polishing used for polishing of copper according to 9 above, wherein said (D) abrasive is a silica particle and/or an organic/inorganic composite particle.
11. An aqueous dispersion for chemical mechanical polishing used for polishing of copper according to 10 above, wherein said compound having said condensed ring includes a structure selected from among quinoline, isoquinoline, benzotriazole, benzimidazole, indole, isoindole, quinazoline, cinnoline, quinoxaline, phthalazine and acridine.
12. An aqueous dispersion for chemical mechanical polishing used for polishing of copper according to 11 above, wherein said compound having said condensed ring is at least one selected from among quinaldic acid, benzotriazole and benzimidazole.
13. An aqueous dispersion for chemical mechanical polishing used for polishing of copper according to 12 above, wherein said (B) surfactant is an anionic surfactant.
14. An aqueous dispersion for chemical mechanical polishing used for polishing of copper according to 13 above, wherein said anionic surfactant is a sulfonic acid salt.
15. An aqueous dispersion for chemical mechanical polishing used for polishing of copper according to 14 above, wherein said sulfonic acid salt is at least one selected from ammonium dodecylbenzenesulfonate and potassium dodecylbenzenesulfonate.
16. An aqueous dispersion for chemical mechanical polishing used for polishing of copper according to 13 above, wherein said (C) oxidizing agent is at least one selected from among ammonium persulfate, potassium persulfate and hydrogen peroxide.

According to the invention it is possible to obtain an aqueous dispersion for chemical mechanical polishing with a high polishing speed for copper and a low overpolishing margin, which is useful for polishing of copper for multilayer wiring in the manufacture of semiconductor devices.

DETAILED DESCRIPTION OF THE INVENTION

The invention will now be explained in greater detail.

The (A) compound having a heterocycle may be a compound which is a condensed ring composed of a benzene ring or naphthalene ring and a heteropentacycle or heterohexacycle with at least one nitrogen atom. Particularly preferred compounds are those including a structure selected from among quinoline, isoquinoline, benzotriazole, benzimidazole, indole, isoindole, quinazoline, cinnoline, quinoxaline, phthalazine and acridine. Of these, compounds having quinoline, benzotriazole and benzimidazole structures are preferred.

Specific examples of such compounds that are preferred for use include quinaldic acid, benzotriazole and benzimidazole. Quinaldic acid is most preferred.

The content of the (A) compound having a heterocycle is preferably 0.01 to 1 wt %, more preferably 0.01 to 0.8 wt % and most preferably 0.05 to 0.6 wt % with respect to the total of the aqueous dispersion. If the content of the (A) compound having a heterocycle is less than 0.01 wt % it may be difficult to sufficiently inhibit erosion. On the other hand, a content of 1 wt % for the (A) compound having a heterocycle is sufficient, and the intended effect can be adequately achieved even at 0.5 wt %.

As the (B) surfactant there may be used cationic surfactant, anionic surfactant or non-ionic surfactant. Among these anionic surfactant is preferable. As anionic surfactant there may be mentioned carboxylic acid salts such as fatty acid soaps and alkylether carboxylic acid salts, sulfonic acid salts such as alkylbenzenesulfonic acid salts, alkylnaphthalenesulfonic acid salts and α-olefinsulfonic acid salts, sulfuric acid ester salts such as higher alcohol sulfuric acid ester salts and alkylether sulfuric acid salts, and phosphoric acid esters such as alkylphosphoric acid esters and the like.

Sulfonic acid salts are preferred among these, with potassium dodecylbenzenesulfonate and/or ammonium dodecylbenzenesulfonate being particularly preferred among sulfonic acid salts.

The content of the (B) surfactant is preferably 0.001 to 0.1 wt % and more preferably 0.005 to 0.075 wt % with respect to the total of the aqueous dispersion. If the content of the (B) surfactant is less than 0.001 wt % it may be difficult to sufficiently inhibit erosion, while a surfactant content of 0.1 wt % is sufficient.

The proportion of the (A) compound having a heterocycle and (B) surfactant is in the range of (A):(B)=1:10 to 1:0.03, and preferably 1:3 to 1:0.05. If the weight ratio of the surfactant exceeds 10 the polishing speed may be notably reduced, whereas if it is less than 0.03 it will be difficult to sufficiently minimize the erosion and erosion rate.

An aqueous dispersion containing these prescribed amounts of the (A) compound having a heterocycle and the (B) surfactant and having the weight ratio of the (A) and (B) within the range specified above can sufficiently minimize the erosion depth and erosion rate.

As examples of the (C) oxidizing agents there may be mentioned hydrogen peroxide, organic peroxides such as peracetic acid, perbenzoic acid, tert-butylhydroperoxide, and the like, permanganate compounds such as potassium permanganate, and the like, bichromate compounds such as potassium bichromate, and the like, halogenate compounds such as potassium iodate, and the like, nitric compounds such as nitric acid, iron nitrate, and the like, perhalogenate compounds such as perchloric acid, and the like, persulfuric compounds such as ammonium persulfate, and the like, and heteropoly acids. Particularly preferred among these oxidizing agents are hydrogen peroxide and organic peroxides which contain no metals and whose decomposition products are harmless and persulfuric compounds such as ammonium persulfate, and the like. Including such oxidizing agents can give an even more vastly improved removal rate.

The content of the (C) oxidizing agent is preferably 0.01 to 15 wt %, more preferably 0.1 to 10 wt % and even more preferably 0.3 to 8 wt % with respect to the total of the aqueous dispersion. If the content of the (C) oxidizing agent is less than 0.01 wt %, a sufficient chemical etching effect cannot be achieved and problems may be presented for the polishing speed, whereas the polishing speed can be adequately improved if the (C) oxidizing agent is included at 15 wt %, and thus there is no need for an amount larger than 15 wt %.

The aqueous dispersion of the invention may also contain (D) an abrasive particle.

The (D) abrasive is not particularly restricted, but it may be used an inorganic particle such as silica, alumina, titania, zirconia, ceria and the like; an organic particle composed of polyolefins and polyolefin copolymers such as polyvinyl chloride polystyrene and styrene copolymer, polyacetals, saturated polyesters, polyamides, polycarbonates, polyethylene, polypropylene, poly-1-butene and poly-4-methyl-1-pentene, phenoxy resins, and (meth)acrylic resins and acrylic copolymers such as polymethyl methacrylate, and an organic/inorganic composite particle comprising an organic particle and an inorganic particle.

The (D) abrasive particle used in the invention is preferably a silica particle or an organic/inorganic composite particle. As silica there may be mentioned, specifically, a fumed silica synthesized by a fume method wherein silicon chloride, aluminum chloride, titanium chloride or the like is reacted with oxygen and hydrogen in a gas phase; a silica synthesized by a sol-gel method which accomplishes synthesis by hydrolysis condensation from a metal alkoxide; and a colloidal silica synthesized by an inorganic colloid method whereby the impurities are removed by purification.

Of these, a colloidal silica synthesized by an inorganic colloid method whereby the impurities are removed by purification is preferred.

The silica particle used as the (D) abrasive particle to be used in the invention is preferably colloidal silica with an average particle size of 100 nm or less, from the standpoint of minimizing erosion and scratching on polishing surfaces. Since metal ions such as iron, nickel and lead remaining in the semiconductor device after the chemical mechanical polishing treatment can result in lower yields, the colloidal silica used preferably has a metal impurity content of 10 ppm or less, more preferably 5 ppm or less, even more preferably 3 ppm or less and most preferably 1 ppm or less.

The organic/inorganic composite particle used as the (D) abrasive particle may have an organic particle and an inorganic particle formed integrally to an extent so as not to easily separate during the polishing process, and there are no particular restrictions on their types or structures.

As the composite particle described above there may be used a particle formed by polycondensation of an alkoxysilane, aluminum alkoxide, titanium alkoxide or the like in the presence of polymer particle of polystyrene, polymethyl methacrylate or the like, and bonding of polysiloxane or the like on at least the surface of the polymer particle. The resulting polycondensate may be directly bonded to the functional group of the polymer particle, or it may be bonded via a silane coupling agent or the like.

A silica particle, an alumina particle or the like may also be used instead of alkoxysilanes. These may be held by intertwining with polysiloxane or the like, or else they may be chemically bonded to the polymer particle by their functional groups such as hydroxyl groups.

In an aqueous dispersion containing an organic particle and an inorganic particle with zeta potentials of opposite signs, the composite particle used may have their particles bonded by electrostatic force.

The zeta potential of the polymer particle is usually negative across the entire pH range, or across a wide pH range except for the low pH range; however, by using a polymer particle having carboxyl group, sulfonic acid group and the like, it is possible to obtain a polymer particle with a more definite negative zeta potential A polymer particle having amino groups and the like has a positive zeta potential in specific pH ranges.

However, the zeta potentials of the inorganic particle is highly pH-dependent and has an isoelectric point at which the potential is zero; the sign of the zeta potential reverses at around that point.

Thus, by combining a specific organic particle and an inorganic particle and mixing them in a pH range at which their zeta potentials are opposite signs, it is possible to form an integral composite of the organic particle and the inorganic particle by electrostatic force. During the mixing, the zeta potentials may be of the same sign, and the pH adjusted thereafter to give zeta potentials of opposite signs, thereby allowing integration of the organic particle and the inorganic particle. The difference of the zeta potential between the organic particle and the inorganic particle is preferable 10 mV or higher, more preferable 20 mV or higher, most preferable 40 mV or higher.

The composite particle used may be prepared by polycondensation of an alkoxysilane, aluminum alkoxide, titanium alkoxide or the like in the presence of the particle integrally composed in this manner by electrostatic force, and bonding of polysiloxane or the like on at least the surface of the particle to form a composite.

The average particle size of the organic/inorganic composite particle is preferably 50 to 500 nm. If the average particle size of the composite particle is less than 50 nm a sufficient polishing speed may not be achieved. If it exceeds 500 nm, the particle will tend to undergo aggregation and precipitation.

The average particle size of the (D) abrasive particle can be measured with a laser scattering diffraction measuring instrument, or else the individual particle may be observed with a transmission electron microscope and the average particle size calculated from the cumulative particle size and the number of particles.

Various additives may also be added to the aqueous dispersion as necessary in addition to the aforementioned. This can further improve the stability of the dispersion, increase the polishing speed, and adjust the difference in polishing speeds when polishing films of different hardness, such as in the case of polishing two or more types of working films. For example, addition of an organic acid or inorganic acid can give a more highly stable aqueous dispersion. As organic acids there may be used para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. These organic acids may be used alone or in combinations of two or more. As inorganic acids there may be mentioned nitric acid, hydrochloric acid, sulfuric acid and the like, and any one or more of these may be used. An organic acid and an inorganic acid may also be used in combination. Organic acids are particularly preferred as acids used to increase the stability of the dispersion. These acids can also be used to increase the removal rate. The contents of these acids may be 0.01 to 5 parts, especially 0.1 to 3 parts and more preferably 0.3–2 parts in 100 parts of the aqueous dispersion. With an acid content within the range of 0.01 to 5 parts it is possible to provide an aqueous dispersion with excellent dispersability and sufficient stability, while it is also preferred from the standpoint of improving the removal rate.

The aqueous dispersion may also contain a polyvalent metal ion with the effect of promoting the function of the oxidizing agent such as hydrogen peroxide, and can thus further improve the removal rate.

As polyvalent metal ions there may be mentioned metal ions such as aluminum, titanium, vanadium, chromium, manganese, iron, cobalt, nickel, copper, zinc, germanium, zirconium, molybdenum, tin, antimony, tantalum, tungsten, lead and cerium. Any one of these may be used, or two or more polyvalent metal ions may be used in combination.

The polyvalent metal ion content may be 3000 ppm or less, and preferably from 10 to 2000 ppm, in the aqueous dispersion.

The polyvalent metal ion may be produced by mixing with the aqueous medium a salt such as a nitric acid salt, sulfuric acid salt or acetic acid salt or a chelate containing a polyvalent metal element, and it may also be produced by mixing an oxide of a polyvalent metal element. There may also be used a compound that produces a monovalent metal ion when mixed with the aqueous medium, but whose ion becomes a polyvalent metal ion by the oxidizing agent. Of these various salts and chelates, iron nitrate is preferred because of its particularly excellent effect of improving the removal rate.

The aqueous dispersion can be adjusted to a pH preferred for improved polishing speed and reduced erosion by addition of one of the aforementioned acids or an alkali. The preferred pH range is 5 to 12, and the pH range of 7 to 11 is more preferred.

Alkali added for adjustment of the pH can be used alkali metal hydroxides such as sodium hydroxide, potassium hydroxide, rubidium hydroxide, cesium hydroxide and the like or ammonia. Adjustment of the pH of the aqueous dispersion can increase the removal rate, and the pH is preferably determined as appropriate within the range where the abrasive can exist stably in consideration of the electrochemical properties of the working surface, the dispersability and stability of the polymer particle and the removal rate.

The etching rate is adjusted by the composition components and pH of the aqueous dispersion to produce an aqueous dispersion for chemical mechanical polishing with the desired polishing performance in the invention.

An aqueous dispersion for chemical mechanical polishing of the invention can be used for chemical mechanical polishing of copper under the desired conditions using a commercially available chemical mechanical polishing apparatus (Model "EPO-112", "EPO-222" by Ebara Laboratories Co., Ltd.; Model "LGP510" or "LGP552" by Lapmaster SFT Co., Ltd.; Model "Mirra" by Applied Materials Corp.).

After polishing, it is preferred to remove the particle remaining on the polishing surface. The removal of the particle may be accomplished by a common washing method.

In the present invention the removal rate by the method shown below is preferably 3000 Å/min or more, more preferably 4000 Å/min or more, most preferably 4500 Å/min or more. And 100 μm wiring erosion by the method shown below is preferably 600 Å or less, more preferably 500 Å or less, most preferably 450 Å or less. The erosion rate calculated from the erosion is preferably 500 Å/min or less, more preferably 400 Å/min or less, most preferably 300 Å/min or less, particularly 200 Å/min or less.

DESCRIPTION OF THE PREFERRED EMBODIMENTS

The present invention will now be explained in greater detail by way of examples.

[1] Fabrication of Boards for Evaluation of Erosion Rates (1) Polishing Board with Copper Wiring (S1)

An insulating layer having a pattern formed by grooves with a depth of 1 μm was laminated on a silicon board surface. A TiN film was then formed to a thickness of 300 Å on the surface of the insulating layer, and then Cu was accumulated to a thickness of 2 μm by sputtering in the grooves covered with the TiN film.

(2) Polishing Board with Copper Wiring (S2)

An insulating layer having a pattern formed by grooves with a depth of 1 μm was laminated on a silicon board surface. A TaN film was then formed to a thickness of 300 Å on the surface of the insulating layer, and then Cu was accumulated to a thickness of 1.3 μm by sputtering and plating in the grooves covered with the TaN film.

[2] Preparation of an Aqueous Dispersion Containing an Inorganic Abrasive Particle or an Abrasive Particle Composed of a Composite Particle (1) Preparation of an Aqueous Dispersion Containing an Inorganic Abrasive Particle (1-1) Preparation of an Aqueous Dispersion Containing a Fumed Silica Particle After dispersing 2 kg of fumed silica (product name: "Aerosil #90", Nihon Aerosil Co., Ltd.) in 6.7 kg of ion-exchange water by an ultrasonic disperser, it was filtered with a filter having a 5 μm pore size, to prepare an aqueous dispersion containing a fumed silica particle.

(1-2) Preparation of an Aqueous Dispersion Containing a Colloidal Silica

After loading 70 g of 25 wt % ammonia water, 40 g of ion-exchange water, 175 g of ethanol and 21 g of tetraethoxysilane into a 2-liter volume flask, the mixture was heated to 60° C. while stirring at 180 rpm, and after continuing the stirring at this temperature for 2 hours, the mixture was cooled to obtain a colloidal silica/alcohol dispersion with an average particle size of 97 nm. An evaporator was then used for several repetitions of a procedure in which the alcohol portion was removed while adding ion-exchange water to the dispersion at a temperature of 80° C., and the alcohol in the dispersion was thereby removed to prepare an aqueous dispersion with a solid concentration of 8 wt %.

An aqueous dispersion of colloidal silica containing colloidal silica with an average particle size of 26 nm or 13 nm was prepared in roughly the same manner except that the amounts of ethanol and tetraethoxysilane were changed.

(2) Preparation of an Aqueous Dispersion Containing a Composite Particle (2-1) Preparation of an Aqueous Dispersion Containing a Polymer Particle After charging 90 parts of methyl methacrylate, 5 parts of methoxypolyethyleneglycol methacrylate (trade name: "NK Ester M-90G", #400, product of Shinnakamura Chemical Industries Co., Ltd.), 5 parts of 4-vinylpyridine, 2 parts of an azo-based polymerization initiator (trade name "V50", product of Wako Junyaku Co., Ltd.) and 400 parts of ion-exchange water into a 2-liter volume flask, the contents were heated to 70° C. while stirring under a nitrogen gas atmosphere, for 6 hours of polymerization. This yielded an aqueous dispersion containing a polymethyl methacrylate-based particle with an average particle size of 0.15 μm, having amino group cations and functional groups having polyethylene glycol chain. The polymerization yield was 95%.

(2-2) Preparation of Aqueous Dispersion Containing a Composite Particle

After loading 100 parts of this aqueous dispersion containing 10 wt % polymethyl methacrylate-based particle which was obtained in (2-1) above into a 2-liter volume flask, 1 part of methyltrimethoxysilane was added and the mixture was stirred at 40° C. for 2 hours. The pH was then adjusted to 2 with nitric acid to obtain aqueous dispersion (a). Also, the pH of an aqueous dispersion containing 10 wt % of colloidal silica (product name: "Snowtex O", product of Nissan Chemical Industries Co., Ltd.) was adjusted to 8 with potassium hydroxide to obtain aqueous dispersion (b). The zeta potential of the polymethyl methacrylate-based particle in aqueous dispersion (a) was +17 mV, and the zeta potential of the silica particle in aqueous dispersion (b) was −40 mV.

After then gradually adding 50 parts of aqueous dispersion (b) to 100 parts of aqueous dispersion (a) over a period of 2 hours and then mixing and stirring for 2 hours, there was obtained an aqueous dispersion containing the particle consisting of the silica particle adhered to the polymethyl methacrylate-based particle. Next, 2 parts of vinyltriethoxysilane was added to this aqueous dispersion, and after stirring for one hour, 1 part of tetraethoxysilane was added, and the mixture was heated to 60° C. and then continually stirred for 3 hours and cooled to obtain an aqueous dispersion containing a composite particle. The average particle size of the composite particle was 180 nm, and the silica particle were adhered to 80% of the surface of the polymethyl methacrylate-based particle.

[3] Preparation of an Aqueous Dispersion for Chemical Mechanical Polishing

Prescribed amounts of the aqueous dispersions prepared in [2], (1) and (2) were each charged into a 1-liter volume polyethylene bottle, and the acid or base aqueous solutions listed in Tables 1 to 4 were added to the acid and base contents also listed in Tables 1 to 4 and thoroughly mixed therewith. Aqueous solutions of the organic compounds and oxidizing agents listed in Tables 1 to 4 were then added to the organic compound and oxidizing agent concentrations listed in Tables 1 to 4 while stirring Next, an aqueous potassium hydroxide solution or nitric acid was added to adjust the pH to the values listed in Tables 1 to 4, after which ion-exchange water was added and the solutions were filtered with a 5 μm pore filter to obtain aqueous dispersions for chemical mechanical polishing for Examples 1 to 9 and Comparative Examples 1 and 2.

TABLE 1

|  |  | Examples | | |
| --- | --- | --- | --- | --- |
|  |  | 1 | 2 | 3 |
| Heterocycle-containing compound (A) | Type | Quinaldic acid | Quinaldic acid | Quinaldic acid |
|  | Content (wt %) | 0.5 | 0.5 | 0.5 |
| Surfactant (B) | Type | Potassium dodecylbenzenesulfonate | Ammonium dodecylbenzenesulfonate | Ammonium dodecylbenzenesulfonate |
|  | Content (wt %) | 0.05 | 0.03 | 0.05 |
| Ratio of (B) to (A) as 1 |  | 0.1 | 0.06 | 0.1 |
| Oxidizing agent | Type | Ammonium persulfate | Hydrogen peroxide | Ammonium persulfate |
|  | Content (wt %) | 1.0 | 5.0 | 1.0 |
| Abrasive | Type | Fumed silica | Fumed silica | Colloidal silica (97 nm) |
|  | Content (wt %) | 1.2 | 5.0 | 1.2 |
| pH adjustor |  | Potassium hydroxide | Ammonia | Potassium hydroxide |
| pH |  | 9.5 | 9.0 | 7.5 |
| Polishing rate (Å/min) |  | 5050 | 4890 | 6320 |
| Erosion (Å) | Board (S1) | 317 | 441 | 212 |
|  | Board (S2) | 424 | 365 | 287 |
| Erosion rate (Å/min) | Board (S1) | 161 | 216 | 134 |
|  | Board (52) | 329 | 275 | 279 |

TABLE 2

|  |  | Examples | | |
| --- | --- | --- | --- | --- |
|  |  | 4 | 5 | 6 |
| Heterocycle-containing compound (A) | Type | Quinaldic acid | Quinaldic acid | benzotriazole |
|  | Content (wt %) | 0.5 | 0.4 | 0.01 |
| Surfactant (B) | Type | Potassium dodecylbenzenesulfonate | Ammonium dodecylbenzenesulfonate | Ammonium dodecylbenzenesulfonate |
|  | Content (wt%) | 0.03 | 0.025 | 0.03 |
| Ratio of (B) to (A) as 1 |  | 0.06 | 0.063 | 3 |
| Oxidizing agent | Type | Ammonium persulfate | Ammonium persulfate | Ammonium persulfate |
|  | Content (wt %) | 1.0 | 1.0 | 1.0 |
| Abrasive | Type | Colloidal silica (26 nm) | Organic/inorganic composite particles | Colloidal silica (26 nm) |
|  | Content (wt %) | 1.2 | 3.0 | 1.2 |
| pH adjustor |  | Potassium hydroxide | Potassium hydroxide | Potassium hydroxide |
| pH |  | 9.2 | 8.9 | 9.2 |
| Polishing rate (Å/min) |  | 4950 | 4120 | 4250 |
| Erosion (Å) | Board (S1) | 208 | 324 | 247 |
|  | Board (S2) | 257 | 226 | 288 |
| Erosion rate (Å/min) | Board (S1) | 103 | 133 | 105 |
|  | Board (S2) | 196 | 143 | 277 |

TABLE 3

|  |  | Examples | | |
| --- | --- | --- | --- | --- |
|  |  | 7 | 8 | 9 |
| Heterocycle-containing compound (A) | Type | 8-quinolinol | Quinaldic acid | Quinaldic acid |
|  | Content (wt %) | 0.5 | 0.5 | 0.4 |
| Surfactant (B) | Type | Ammonium dodecylbenzenesulfonate | Ammonium dodecylbenzenesulfonate | Ammonium dodecylbenzenesulfonate |
|  | Content (wt %) | 0.03 | 0.05 | 0.05 |
| Ratio of (B) to (A) as 1 |  | 0.06 | 0.1 | 0.125 |
| Oxidizing agent | Type | Ammonium persulfate | Hydrogen peroxide | Hydrogen peroxide |
|  | Content (wt %) | 1.0 | 0.05 | 0.1 |
| Abrasive | Type | Colloidal silica (26 nm) | (1)Fumed silica (2)Organic/inorganic composite particle | (1)Colloidal silica (26 nm) (2)Organic/inorganic composite particle |
|  | Content (wt %) | 1.2 | (1)/(2) = 0.5/0.5 | (1)/(2) = 1.0/0.5 |
| pH adjustor |  | Potassium hydroxide | Ammonia | Ammonia |
| pH |  | 9.2 | 9.4 | 9.3 |
| Polishing rate (Å/min) |  | 4110 | 5100 | 5250 |
| Erosion (Å) | Board (S1) | 312 | 340 | 397 |
|  | Board (S2) | 356 | 402 | 311 |
| Erosion rate (Å/min) | Board (S1) | 128 | 173 | 208 |
|  | Board (S2) | 225 | 315 | 251 |

TABLE 4

|  |  | Comparative examples | |
|---|---|---|---|
|  |  | 1 | 2 |
| Heterocycle-containing compound (A) | Type | 8-quinolinol | Quinaldic acid |
|  | Content (wt %) | 0.4 | 0.5 |
| Surfactant (B) | Type | Potassium lauryl sulfate | Ammonium dodecylbenzenesulfonate |
|  | Content (wt %) | 0.004 | 0.005 |
| Ratio of (B) to (A) as 1 |  | 0.01 | 0.01 |
| Oxidizing agent | Type | Hydrogen peroxide | Ammonium persulfate |
|  | Content (wt %) | 5.0 | 1.0 |
| Abrasive | Type | Fumed silica | Colloidal silica (26 nm) |
|  | Content (wt %) | 1.2 | 1.2 |
| pH adjustor |  | Potassium hydroxide | Ammonia |
| pH |  | 9.0 | 9.2 |
| Polishing rate (Å/min) |  | 4230 | 4120 |
| Erosion (Å) | Board (S1) | 1870 | 1971 |
|  | Board (S2) | 2015 | 2130 |
| Erosion rate (Å/min) | Board (S1) | 791 | 812 |
|  | Board (S2) | 1311 | 1350 |

[4] Polishing of Copper Film-Plated Wafers

The aqueous dispersions of Examples 1 to 9 and Comparative Example 1 and 2 were used for polishing of copper film-plated wafers under the following conditions.
Polishing apparatus: Model "LGP510" by Lapmaster SFT Co., Ltd.
Polishing pad: Product name "IC1000-050-(603)-(P)-S400J", by Rodel Co., Ltd. (U.S.)
Working load: 300 g/cm$^2$
Wafer carrier rotation speed: 80 rpm
Plate rotation speed: 100 rpm
Polishing agent supply rate: 200 milliliters/min
Polishing time: 3 minutes The polishing rate was calculated by the following equation. The results are shown in Tables 1 to 4.

Polishing rate (Å/$min$)=(thickness of each film before polishing (Å)−thickness of each film after polishing (Å))/polishing time ($min$)

The thickness of each film was measured using a resistance measuring instrument (Model "Z-5" by NPS Corp.), determining the sheet resistance by the direct current 4-needle method and calculating by the following equation from its resistivity and the copper resistivity.

Thickness of each film (Å)=sheet resistivity ($\Omega$/cm$^2$)× copper resistivity ($\Omega$/cm)×10$^{-8}$

[5] Evaluation of Erosion and Erosion Rate

The erosion evaluation was carried out using a surface roughness tester (Model "P-10" by KLA-Tencor Corp.), with 100 μm wirings on board (S1) and board (S2). The polishing time for the erosion evaluation was the time (in minutes) of the value of the initial excess copper film [thickness X (Å)] divided by the polishing rate V (Å/min) obtained in [4] (X/V) (min) Multiplied by 1.5. The Erosion Rate was Calculated by the Following Equation. The Results of the Erosion and Erosion Rate Evaluation are Shown in Tables 1 to 4.

Erosion rate (Å/$min$)=(X/V) using 100 μm wiring×erosion (Å) upon polishing for 1.5 minutes/[(X/V)×0.5 ($min$)]

Here, the "erosion" is the distance (level difference) between the flat surface formed by the insulating film or barrier metal and the lowest area of the wiring section.

From the results in Tables 1 to 4 it is seen that the aqueous dispersions for chemical mechanical polishing of Examples 1 to 9 had sufficiently high polishing rates of 4000 Å/min or greater. The aqueous dispersions for chemical mechanical polishing of Examples 1 to 9 had low 100 μm wiring erosion of 450 Å or less, a low erosion rate of 330 Å/min as calculated from the erosion. That shows a satisfactory overpolishing margin. On the other hand, in Comparative Examples 1 and 2 which had a low weight ratio of 0.01 for the surfactant with respect to the compound having a heterocycle, the polishing rate was sufficient but it was inferior because of a high erosion and erosion rate.

What is claimed is:

1. An aqueous dispersion for chemical mechanical polishing used for polishing of copper comprising (A) a quinaldic acid, (B) an anionic surfactant which is a sulfonic acid salt and (C) an oxidizing agent, wherein the weight ratio of said (A):(B) is 1:10 to 1:0.03.

2. The aqueous dispersion according to claim 1, which further contains (D) an abrasive.

3. The aqueous dispersion according to claim 2, wherein said (D) abrasive is a silica particle.

4. The aqueous dispersion according to claim 3, wherein said sulfonic acid salt is one selected from the group consisting of an alkylbenzenesulfonic acid salt and an alkylnaphthalenesulfonic acid salt.

5. The aqueous dispersion according to claim 2, wherein said (D) abrasive is an organic/inorganic composite particle.

6. The aqueous dispersion according to claim 2, wherein said (D) abrasive comprises a silica particle and an organic/inorganic composite particle.

7. A chemical mechanical polishing method comprising polishing a copper surface with an aqueous dispersion containing (A) a compound having a heterocycle, (B) anionic surfactant which is a sulfonic acid salt, (C) an oxidizing agent and (D) an abrasive, wherein the weight ratio of said (A):(B) is 1:10 to 1:0.03.

8. The method according to claim 7, wherein said sulfonic acid salt is one selected from the group consisting of an alkylbenzenesulfonic acid salt and an alkylnaphthalenesulfonic acid salt.

9. The method according to claim 7, wherein said (A) compound having said heterocycle is a compound having a condensed ring comprising a benzene ring or a naphthalene ring and a heterohexacycle with one nitrogen atom.

10. The method according to claim 7, wherein said compound having said ring is quinaldic acid.

11. The method according to claim 9, wherein said (D) abrasive is a silica particle.

12. The method according to claim 9, wherein said (D) abrasive is an organic/inorganic composite particle.

13. The method according to claim 9, wherein said (D) abrasive is a silica particle and an organic/inorganic composite particle.

14. The aqueous dispersion according to claim 1, wherein said sulfonic acid salt is one selected from the group consisting of an alkylbenzenesulfonic acid salt and an alkylnaphthalenesulfonic acid salt.

* * * * *